US007834372B2

(12) United States Patent
Zhai et al.

(10) Patent No.: US 7,834,372 B2

(45) Date of Patent: Nov. 16, 2010

(54) HIGH LUMINOUS FLUX WARM WHITE SOLID STATE LIGHTING DEVICE

(76) Inventors: Jinhui Zhai, 1732 Split Fork Dr., Oldsmar, FL (US) 34677; Israel Morejon, 9815 Tree Tops Lake Rd., Tampa, FL (US) 33626; Thong Bui, 3034 Savanna Oaks Cir., Tarpon Springs, FL (US) 34688

(*) Notice: Subject to any disclaimer, the term of this patent is extended or adjusted under 35 U.S.C. 154(b) by 115 days.

(21) Appl. No.: 12/336,107

(22) Filed: Dec. 16, 2008

(65) Prior Publication Data

US 2010/0148191 A1 Jun. 17, 2010

(51) Int. Cl.
*H01L 33/60* (2010.01)

(52) U.S. Cl. ............................ 257/98; 257/88; 257/95; 257/99; 257/100; 257/E33.058; 257/E33.055; 257/E33.072

(58) Field of Classification Search .................. 257/79, 257/98, 88, 95, 99, 100, E33.055, E33.058, 257/E33.072
See application file for complete search history.

(56) References Cited

U.S. PATENT DOCUMENTS

| | | | | |
|---|---|---|---|---|
| 5,581,150 | A * | 12/1996 | Rack et al. | 313/509 |
| 6,234,645 | B1 | 5/2001 | Borner et al. | |
| 7,061,454 | B2 | 6/2006 | Sasuga et al. | |
| 7,213,940 | B1 | 5/2007 | Van De Ven et al. | |
| 7,215,074 | B2 | 5/2007 | Shimizu et al. | |
| 7,332,746 | B1 * | 2/2008 | Takahashi et al. | 257/98 |
| 7,387,405 | B2 | 6/2008 | Ducharme et al. | |
| 7,390,684 | B2 | 6/2008 | Izuno et al. | |
| 2002/0079506 | A1 * | 6/2002 | Komoto et al. | 257/99 |
| 2007/0221938 | A1 | 9/2007 | Radkov et al. | |
| 2007/0223219 | A1 * | 9/2007 | Medendorp et al. | 362/231 |
| 2007/0263393 | A1 | 11/2007 | Van De Ven et al. | |
| 2007/0278503 | A1 | 12/2007 | Van De Ven et al. | |
| 2007/0278934 | A1 | 12/2007 | Van De Ven et al. | |
| 2008/0130285 | A1 | 6/2008 | Negley et al. | |
| 2008/0136313 | A1 | 6/2008 | Van De Ven et al. | |
| 2008/0165539 | A1 * | 7/2008 | Hsu et al. | 362/309 |

* cited by examiner

*Primary Examiner*—Ngan Ngo
*Assistant Examiner*—Benjamin Tzu-Hung Liu
(74) *Attorney, Agent, or Firm*—Harvey Kauget; Phelps Dunbar LLP

(57) ABSTRACT

A high luminous flux warm white solid state lighting device with a high color rendering is disclosed. The device comprising two groups of semiconductor light emitting components to emit and excite four narrow-band spectrums of lights at high luminous efficacy, wherein the semiconductor light emitting components are directly mounted on a thermal effective dissipation member; a mixing cavity for blending the multi-spectrum of lights; a back-transferred light recycling member deposited on top of an LED driver and around the semiconductor light emitters; and a diffusive member to diffuse the mixture of output light from the solid state lighting device. The solid state lighting device produces a warm white light with luminous efficacy at least 80 lumens per watt and a color rendering index at least 85 for any lighting application.

2 Claims, 3 Drawing Sheets

HIGH LUMINOUS FLUX WARM WHITE SOLID STATE LIGHTING DEVICE

FIELD OF INVENTION

The invention relates generally to solid state lighting devices, as well as related components, systems and methods, and more particularly to methods to make warm white light with high color rendering and high luminous efficacy.

BACKGROUND OF THE INVENTION

It is well known that incandescent light bulbs are very energy inefficient light sources—about 90% of the electricity they consume is released as heat rather than light. Fluorescent light bulbs are by a factor of about 10 more efficient, but are still less efficient than a solid state semiconductor emitter, such as light emitting diodes, by a factor of about 2.

In addition, incandescent light bulbs have a relatively short lifetime, i.e., typically about 750 to 1000 hours. Fluorescent bulbs have a longer lifetime (e.g., 10,000 to 20,000 hours) than incandescent lights, but they contain mercury, not an environment friendly light source, and they provide less favorable color reproduction. In comparison, light emitting diodes have a much longer lifetime (e.g., 50,000 to 75,000 hours). Furthermore, solid state light emitters are very environmentally "green" light sources and they can achieve very good color reproduction.

Accordingly, for these and other reasons, efforts have been ongoing to develop solid state lighting devices to replace incandescent light bulbs, fluorescent lights and other light-generating devices in a wide variety of applications. In addition, where light emitting diodes (or other solid state light emitters) are already being used, efforts are ongoing to provide improvement with respect to energy efficiency, color rendering index (CRI Ra), luminous efficacy (lm/W), color temperature, and/or duration of service, especially for indoor applications.

A semiconductor light emitting device utilizing a blue light emitting diode having a main emission peak in blue wavelength range from 400 nm to 490 nm, and a luminescent layer containing an inorganic phosphor that absorbs blue light emitted by the blue LED and produces an exciting light having an emission peak in a visible wavelength range from green to yellow (in the range of about 525 nm to 580 nm) with spectrum bandwidth (full width of half maximum, simply refer to FWHM) about 80 to 100 nm.

Almost all the known light emitting semiconductor devices utilizing blue LEDs and phosphors in combination to obtain color-mixed light of the emission light from the blue LEDs and excitation light from the phosphors use YAG-based or silicate-based luminescent layer as phosphors. Those solid state lighting devices have typically white color temperature about 5000 K to 8500 K with low color rending index Ra about 60~70. This white solid state lighting device is not desirable for some applications, like indoor applications, which require warm white color about 2700 K to 3500 K with a high color rending index Ra above 80.

Known warm white semiconductor light emitting solutions and their low luminous efficacy issues are shown at the followings:

1. Blue LED with mixture YAG-based or silicate-based phosphors (for exciting yellow light) and nitrides or sulfides phosphors (for exciting red light) for a warm white light. YAG-based or silicate-based phosphors excite a broad-band yellow light having a full spectrum range from 500 nm to 650 nm with FWHM about 80~100 nm. But this yellow excitation light has a shortage in red and bluish green wavelength range, which limits its color rendering index Ra less than 70. Adding a red phosphor to the yellow phosphor can compensate for a shortage of red light, resulting in improved color rendering index about 75~80. But the red phosphor absorbs the emission blue light (with a peak wavelength around 460 nm) and excites a red light (with a peak wavelength around 620 nm), which causes a significant Stoke-shift issue in photonic energy loss. Another issue with the mixture of yellow and red phosphors is the broad-band spectrum distribution of the excitation light, where luminous flux contribution is low at two edge spectrums range due to the low sensitivity of red and bluish green wavelength light to the human eye.
2. Blue LED with mixture YAG-based or silicate phosphors (for exciting green light) and nitrides or sulfides phosphors (for exciting orange light) for a high color rendering warm white light. The mixture of green and orange phosphors can compensate for the shortage of red light and bluish green light, resulting in warm white with high color rendering index above 80. But it has three issues which will cause low luminous efficacy: a) multi-phosphors self-absorption loss of the photons excited from the green and orange phosphor particles; b) Stoked-shift loss from blue-to-red wavelength conversion; c) low luminous flux contribution from the red and bluish green wavelength in the broad-band spectrum distribution edge of the excitation light.
3. Blue LED with YAG-based or silicate-based phosphors (for exciting yellow light or blue shifting yellow light) and mixing with a semiconductor emitting red/amber color light for a high color rendering warm light. Adding red/amber semiconductor emitters directly to the solid state white lighting device can solve the issues of multi-phosphors self-absorption loss and Stokes shift loss of the blue-to-red wavelength conversion. But it still suffers from a low luminous flux contribution issue from the red and bluish green wavelength range in the broad-band spectrum distribution of the excitation light. And it still has a shortage of bluish green wavelength. Besides this, more efforts are ongoing to improve the light mixture from the multi-color semiconductor light emitters.

BRIEF SUMMARY OF THE INVENTION

To overcome low luminous efficacy and low color reproduction issues from the known warm white semiconductor light emitting device. The present application discloses a system and a method of a solid state lighting device to generate a high color rendering warm white light at a high luminous efficacy. The solid state lighting device includes a first group of semiconductor light emitting components generating a mixture light of an emitted first spectrum blue light and an excited second spectrum yellow light having a narrow bandwidth; a second group of semiconductor light emitting components emitting at least a third spectrum narrow-band reddish orange light to compensate for the shortage of red wavelength in the narrow-band yellow excitation light; a fourth spectrum narrow-band green light either excited from the first group of semiconductor light emitting components or emitted from the second group of semiconductor light emitting components to compensate for the shortage of bluish green wavelength in the narrow-band yellow excitation light; a diffusive output window member having an air space to the semiconductor light emitting components to diffuse the first and second groups of the emission lights; a back-transferred light recycling member to convert the back-transferred light into a forward-transferred light; and a light mixing cavity between the groups of the semiconductor light emitting components, the back-transferred light recycling member and the diffusive member for mixing the multi-spectrums lights. The first and second groups of semiconductor light emitting components directly mounted on a thermal effective dissipation member. If a current is supplied to the power string line, a mixture of light from the first and second groups of the semiconductor light emitting components produce a high luminous flux warm white light with luminous efficacy at least 80 lumens per watt and color rendering index at least 85 for any indoor lighting applications.

In one embodiment, the first group of the semiconductor light emitting components generates a high luminous efficacy sub-mixture of white light from an emitted blue light and an excited yellow light with a peak wavelength of 550 nm~575 nm and a spectrum width FWHM less than 75 nm. The chromaticity coordinates of a sub-mixture of white light is closed to the blackbody locus on 1931 CIE. The second group of semiconductor light emitting components generates a sub-mixture of yellowish orange light from the semiconductor reddish orange emitters and the semiconductor green emitters, which all have state-of-art high luminous efficacy. The second group of lights compensates for the shortage of red and bluish green wavelength range in the first group of narrow-band yellow excitation light. The mixture of the first and second semiconductor emitting components produces a high luminous flux warm white light with a high luminous efficacy, as well as a high color rendering index.

In another embodiment, the first group of the semiconductor light emitting components comprises a semiconductor blue light emitter; a yellow phosphor layer to absorb blue light and excite a yellow light with a spectrum width FWHM less than 75 nm; and a green phosphor layer with a space to a yellow phosphor layer to absorb the leakage blue light and convert it into a green light with a spectrum width FWHM less than 75 nm. The sub-mixture of the emitted blue light and excited yellow and green lights has chromaticity coordinates above a blackbody locus on 1931 CIE at improved luminous efficacy. The second group of the semiconductor light emitting components has a semiconductor reddish orange emitters with a state-of-art high luminous efficacy to compensate for the shortage of red wavelength in the first group sub-mixture of light. The mixture of the first and second semiconductor emitting components produce a high luminous flux warm white light with high luminous efficacy, as well as a high color rendering index.

In another embodiment, the first group of the semiconductor light emitting components includes at least one semiconductor light emitter array in a single package having a high reflection coating on the top surface of a substrate. A first phosphor layer deposited on top of the reflective substrate to cover both the semiconductor light array emitters and the space between the semiconductor light array emitters to excite a second spectrum of yellow light with a narrow bandwidth. A second phosphor layer on top of the first phosphor layer to excite a third spectrum of green light from the leakage of first spectrum light to improve its luminous efficacy.

In another embodiment, a method of mixing the lights from the two groups of the semiconductor light emitting components is provided. The method includes a light mixing cavity between the semiconductor light emitting components, the back-transferred light recycling member and the light diffusive member. The back-transferred light recycling member will convert the backscattering light from the diffusive member and the emission/excitation light from the semiconductor light emitting components into a forward-transferred light and export from the diffusive output window. The lights from the two groups of the semiconductor light emitting components get completely mixed before exporting through the diffusive output window of the solid state lighting device.

In another embodiment, the back-transferred recycling member includes a wavelength conversion layer. The wavelength conversion layer will convert the emission of short wavelength light into a desired visible wavelength to recycle the back-transferred light and at same time to adjust the mixing light chromaticity.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

An object of the present invention is to suppress certain wavelength spectrums shortage, Stoke-shift loss of blue-to-red wavelength conversion, multi-phosphors absorption loss and radiance power loss at red/bluish green tail range of a broad-band excited yellow light in a warm white solid state lighting device by utilizing a narrow-band excited yellow light mixing with semiconductor emitting yellowish orange light, in combination with a forth spectrum green light in a mixing cavity so as to provide a solid state lighting device or solid state lighting system in warm white color temperature range exhibiting a luminous flux higher than known white-light emitting semiconductor devices and a high color rendering index above 85.

The First Aspect of the Present Invention

Figure 1:
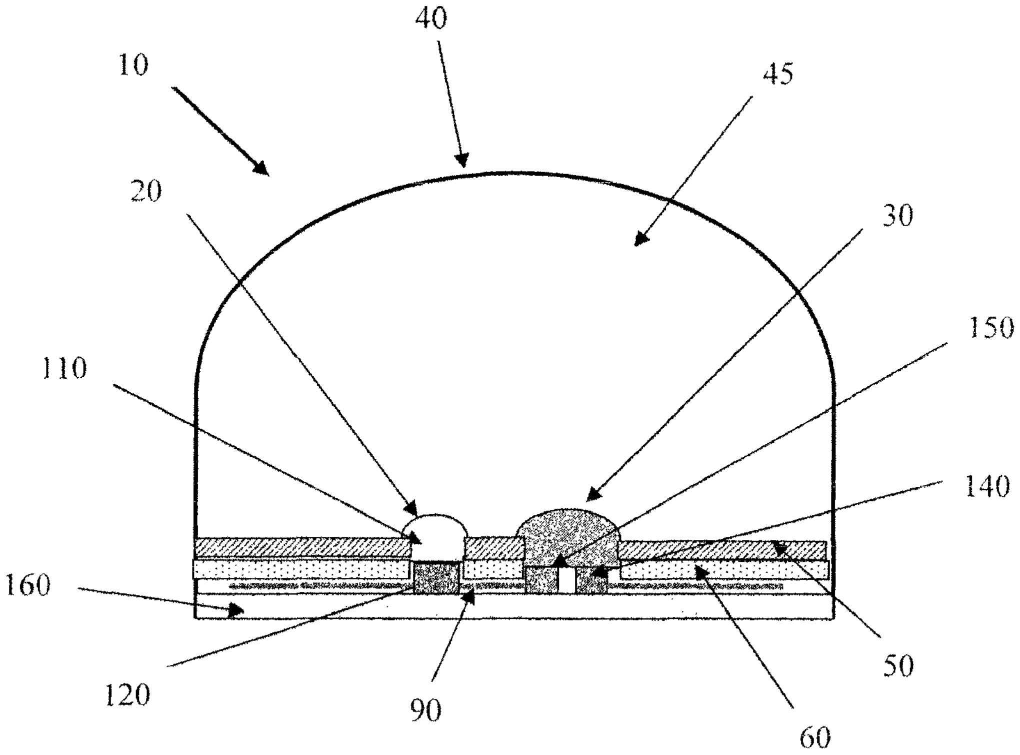
FIG. 1 is a cross sectional view of one embodiment of a solid state lighting device according to the present invention.

According to the first aspect of the present invention as shown in FIG. 1, a solid state lighting device 10 comprising a first group of semiconductor light emitting components 20; a second group of semiconductor light emitting components 30; a single power string line 90; a back-transferred recycling member 60; a diffusive member 40 and a mixing cavity 45 formed inside of the above members.

The first group of semiconductor light emitting components 20 generate a high luminous efficacy sub-mixture of white light. The first group of semiconductor light emitting components 20 includes at least one semiconductor light emitter 80 for a first spectrum short wavelength light 120 and at least one down-conversion phosphor layer 100 on top of the semiconductor light emitter 80 for exciting a second spectrum of yellow light 130 with a narrow bandwidth. Wherein, the spectral emission of the first spectrum light 120 has a peak wavelength range from 440 nm~465 nm; the spectral emission of the second spectrum light 130 has a peak wavelength range from 550 nm~575 nm at a spectrum width FWHM less than 75 nm. In this excited narrow-band yellow light spectrum distribution, the bluish green tail wavelength range from 500 nm~520 nm and red tail wavelength range from 620 nm~650 nm have been significantly cut-off to reduce photons energy loss at these human eye less sensitivity spectrums range.

The second group of semiconductor light emitting components 30 generate at least a third spectrum of reddish orange light 140. The spectral emission of the third spectrum light 140 has a peak wavelength range from 610 nm~620 nm with FWHM less than 25 nm. The second group of emitted reddish orange light 140 will compensate for the shortage of bluish green light in the first group of yellow excite light 130.

A fourth spectrum of green light 150 either exciting from the first group of semiconductor light emitting components 20 or emitting from the second group of semiconductor light emitting components 30. The spectral emission of the fourth spectrum of light 150 has a peak wavelength range from 525 nm~535 nm. The fourth spectrum of green light 150 will compensate for the shortage of bluish green light in the first group of yellow excited light 130.

A dome lens 75 from a high refractive index above 1.5 may be deposited on top of each semiconductor light emitter to reduce total internal reflection loss.

The single power string line 90 electrically connects each of the first group of semiconductor light emitting components 20 and each of the second group of semiconductor light emitting components 30.

A light mixing cavity 45 is formed inside of the semiconductor light emitting components (LEDs), the LED driver board 55 and the diffusive output window 40. The diffusive output window 40 having an air space to the semiconductor light emitting components 20, 30. A back-transferred recycling member 60 is deposited inside the light mixing cavity 45 on top of the LED driver board 55 and around the semiconductor light emitting components 20, 30 to convert back-transferred light into a forward-transferred light and exported from the diffusive output window 40.

Figure 2:
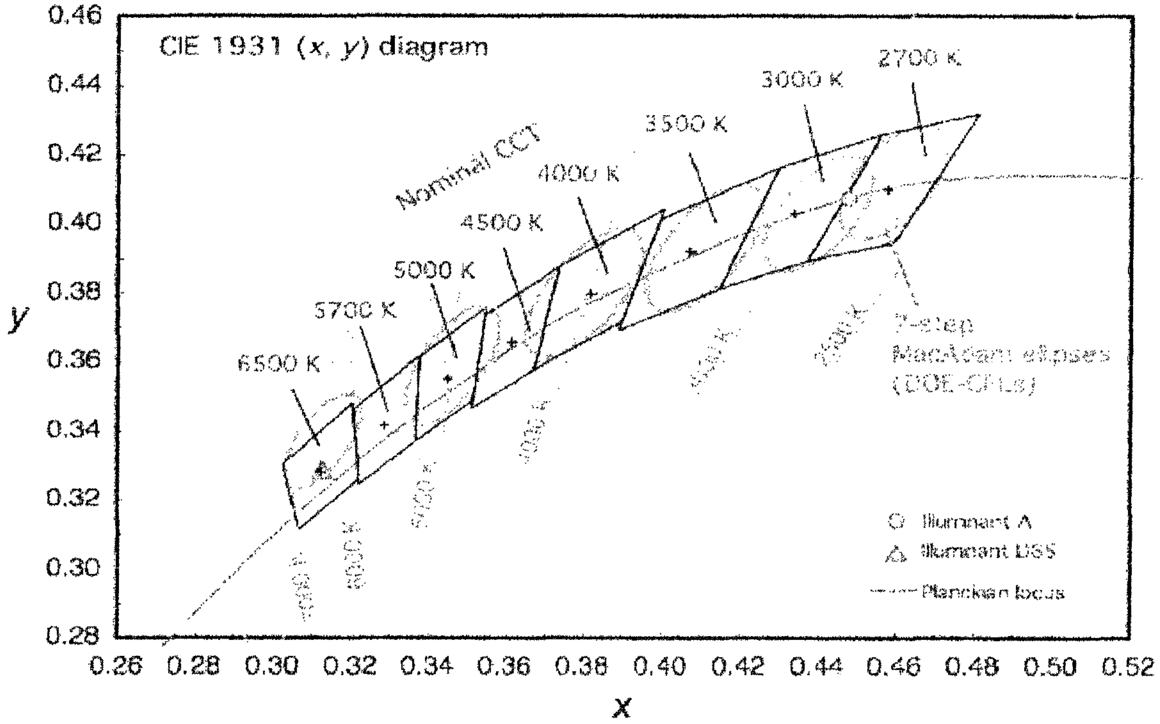
FIG. 2 is a CIE 1931 diagram.

If a current is supplied to the power string line 90, a combination of the first spectrum light 120 and the second spectrum light 130 emitting from the first group of semiconductor light emitting components 20, in an absence of any additional light, produce a sub-mixture of white light with corrected color temperature (CCT) in a 4500 K~6000 K range and a luminous efficacy greater than 90 lm/W; a combination of the third spectrum light 140 and the fourth spectrum light 150, in an absence of any additional light, produce a sub-mixture of yellowish orange light with a luminous efficacy greater than 90 lm/W; and a combination of 1) Light producing from the first group of semiconductor light emitting components 20, and 2) Light producing from the second group of semiconductor light emitting components 30 produces a mixture of warm white light within ten MacAdam ellipses with at least one point on a blackbody locus, as shown in FIG. 2, having a correct color temperature in a 2700 K~3500 K range with a color rendering index (CRI) at least 85.

In some embodiments according to the first aspect of the present invention, the solid state lighting device 10 may comprise the first spectrum light 120 and the second spectrum light 130 from the first group of semiconductor light emitting components 20, producing a mixture of light having (x,y) coordinates on 1931 CIE within an area enclosed by four line segments having (x,y) coordinates (0.325,0.310), (0.360,0.330), (0.370,0.400), and (0.320,0.390); and the third spectrum light 140 and the fourth spectrum light 150 from the second group of semiconductor light emitting components 30, producing a mixture of light having (x,y) coordinates on 1931 CIE within an area enclosed by four line segments having (x,y) coordinates (0.500,0.450), (0.525,0.465), (0.565,0.425), and (0.520,0.420);

In some embodiments according to the first aspect of the present invention, the solid state lighting device 10 may comprise semiconductor light emitting components 20 (LEDs) directly packaged on a thermal effective dissipation member 160.

Figure 5:
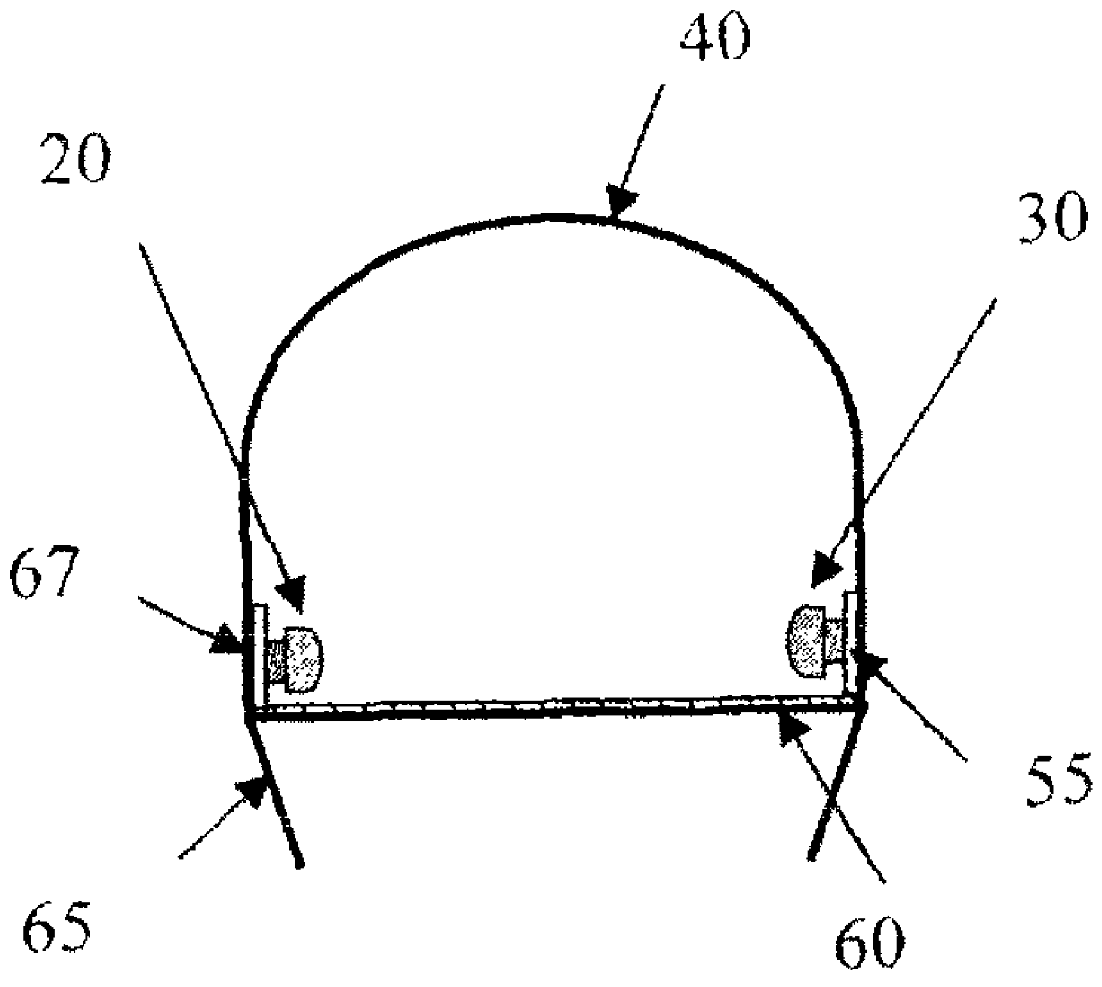
FIG. 5 is a cross sectional view of one embodiment of a solid state lighting device according to the present invention.

As shown in FIG. 5, in some embodiments according to the first aspect of the present invention, the solid state lighting device 10 may comprise semiconductor light emitting components 20 (LEDs) directly packaged on the side wall 67 of the solid state lighting device body 65 for thermal effective dissipation and have a reflective member 70 to redirect light into a forward-transferred light and mixed at the mixing cavity 45 before exported from the diffusive output window 40.

In some embodiments according to the first aspect of the present invention, the solid state lighting device 10 may comprise a back-transferred light recycling component 60 including a wavelength conversion component 50. The wavelength conversion component 50 is deposited on top of the back-transferred recycling member 60. The wavelength conversion component 50 absorbs backscattering short wavelength light from the diffusive member 40 and emission light from the semiconductor emitting components 20, and converts it into desired visible light to adjust the mixing light chromaticity.

In some embodiments according to the first aspect of the present invention, the phosphor layer in the first group of semiconductor light emitting components 20 may be quantum dots, exciting a yellow light with a narrow bandwidth of FWHM less than 75 nm.

In some embodiments according to the first aspect of the present invention, the first group of semiconductor light emitting components 20 may include at least one semiconductor emitter 80 for emitting a first spectrum of blue or near UV light; at least a first phosphor layer 100 on top of the semiconductor emitter 80 excited by the first spectrum light 120 and produce a second spectrum of yellow light 130; at least a second phosphor layer 110 on top of the first phosphor layer 100 excited by the leakage from the first spectrum of light 120 and produces a forth spectrum of green light 150. It may have a transparent dome lens 75 deposited between the first phosphor layer 100 and the second phosphor layer 110.

In some embodiments according to the first aspect of the present invention, the first group of semiconductor light emitting components 20 may include a semiconductor emitter 80 for emitting near-UV exciting light in a center wavelength range 380 nm~420 nm and at least two quantum dots to absorb the near-UV exciting light and produce a first spectrum of blue light 120 and a second spectrum of yellow light 130.

In some embodiments according to the first aspect of the present invention, the second group of semiconductor light emitting components 30 may include a green semiconductor light emitter and a reddish orange semiconductor emitter. The green semiconductor light emitter and the reddish orange semiconductor light emitter are packaged on a single substrate chip 70. A high refractive index dome lens is used to encapsulate the co-package dies. The green and reddish orange light are mixed in the encapsulation resin to produce a mixture of yellowish orange light.

In some embodiments according to the first aspect of the present invention, the second group of solid state light components 30 may include a green semiconductor emitter and a phosphor excited by the green light to emit a reddish orange light. A combination of the emitted green light and the excited reddish orange light produce a mixture of light having (x,y) coordinates on 1931 CIE within an area enclosed by four line segments having (x,y) coordinates (0.500,0.450), (0.525,0.465), (0.565,0.425), and (0.520,0.420).

The Second Aspect of the Present Invention

Figure 3:
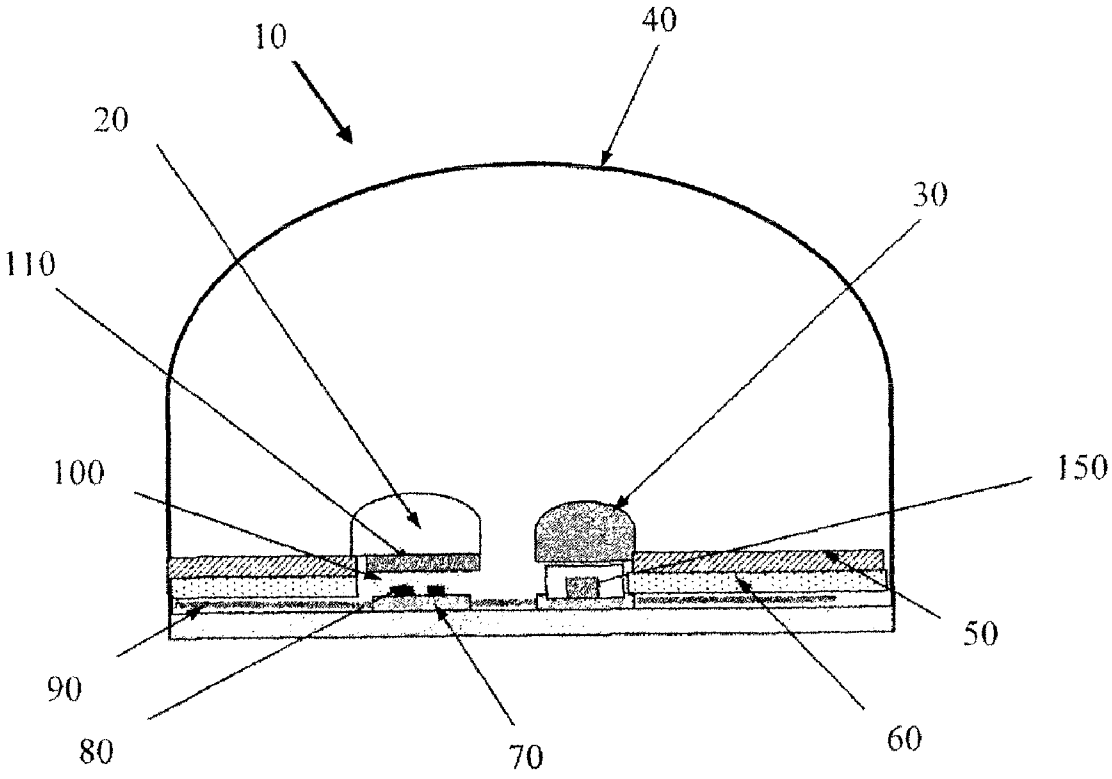
FIG. 3 is a cross sectional view of one embodiment of a solid state lighting device according to the present invention.

According to the second aspect of the present invention as shown in FIG. 3, a solid state lighting device comprising a first group of semiconductor light emitting components 20 in a single package; a second group of semiconductor light emitting components 30; a single power string line 90; a back-transferred recycling member 60; a diffusive member 40 and a mixing cavity 45 formed inside of the above members.

The first group of semiconductor light emitting components 20 include a semiconductor light emitter array 80 packaged on a single substrate 70 having a high reflection coating on the top surface to produce a first spectrum of short wavelength light 120; a first phosphor layer 100 deposited on top of the reflective substrate 70 to cover the entire substrate along with the first group of semiconductor light emitting components 20 and the second group of semiconductor light emitting components 30 to excite a second spectrum of yellow light 130 with a narrow bandwidth; and at least a second phosphor layer 110 on top of the first phosphor layer 100 to excite a third spectrum of green light 140 from the leakage of the first spectrum light 120 to improve its luminous efficacy.

In a addition, a short-pass dichroic filter can be placed on top of said first group of semiconductor light emitting components.

The second group of semiconductor light emitting components 30 generates at least a fourth spectrum of reddish orange light 150 to compensate for the shortage of red wavelength in first group of excited yellow light.

The single power string line 90 electrically connects to each of the first group of semiconductor light emitting components 20 and each of the second group of semiconductor light emitting components 30.

A light mixing cavity 45 is formed inside of the semiconductor light emitting components 20, 30 (LEDs), the LED driver board 55 and the diffusive output window 40. The diffusive output window 40 having an air space to the semiconductor light emitting components 20, 30. A back-transferred recycling member 60 is deposited inside the light mixing cavity 45 on top of the LED driver board 55 and around the semiconductor light emitting components 20, 30 to convert back-transferred light into a forward-transferred light and exports the light from the diffusive output window 40.

Wherein, the spectral emission of the first spectrum of light 120 from the first group of semiconductor light emitting components 20 has a center wavelength range from 440 nm~465 nm; the spectral emission of the second spectrum of light 130 from the first group of semiconductor light emitting components 20 has a center wavelength range from 550~575 nm with FWHM less than 75 nm; the spectral emission of the third spectrum of light 140 from the first group of semiconductor light emitting components 20 has a center wavelength range from 525 nm~540 nm with FWHM less than 75 nm; and the spectral emission of the fourth spectrum of light 150 from said second group of semiconductor light emitting components 30 has a center wavelength range from 610 nm~620 nm with FWHM less than 25 nm. In the narrow-band of exciting yellow light, the bluish green tail wavelength range from 500 nm~520 nm and red tail wavelength range from 620 nm~650 nm have been significantly cut-off to reduce photons energy loss of the excited yellow light at these human eye less sensitivity spectrums range. The narrow-band of yellow excitation light and additional green phosphor on top of the yellow phosphor will enhance the luminous efficacy of the sub-mixture of greenish white light.

If a current is supplied to the power string line 90, the first spectrum emission of light 120, second spectrum of excitation light 130 and third spectrum of excitation light 140 from the first group of semiconductor light emitting components 20, produces a mixture of light having (x,y) coordinates on 1931 CIE within an area enclosed by four line segments having (x,y) coordinates (0.325,0.310), (0.360,0.330), (0.370,0.400), and (0.320,0.390) with an enhanced luminous efficacy at least 90 lm/W; and a combination of 1) Light produced from the first group of solid state lighting components 20, and 2) Light produced from the second group of solid state lighting components 30 produces a mixture of light within ten MacAdam ellipses with at least one point on a blackbody locus, having a correct color temperature in a 2700 K~3500 K range with a color rendering index (CRI) at least 85.

In some embodiments according to the second aspect of the present invention, the first group of semiconductor light emitting components 20 include a semiconductor light emitter array 80 for emitting blue light in a center wavelength range of 450 nm~465 nm.

In some embodiments according to the second aspect of the present invention, the first group of semiconductor light emitting components 20 include a semiconductor light emitter array 80 for emitting near UV light in a center wavelength range of 380 nm~420 nm.

In some embodiments according to the second aspect of the present invention, the first group of the semiconductor light emitting components 20 include a dome 75 from a high refractive index resin deposited on top of the second phosphor layer 110 to reduce total internal reflection loss.

The Third Aspect of the Present Invention

Figure 4:
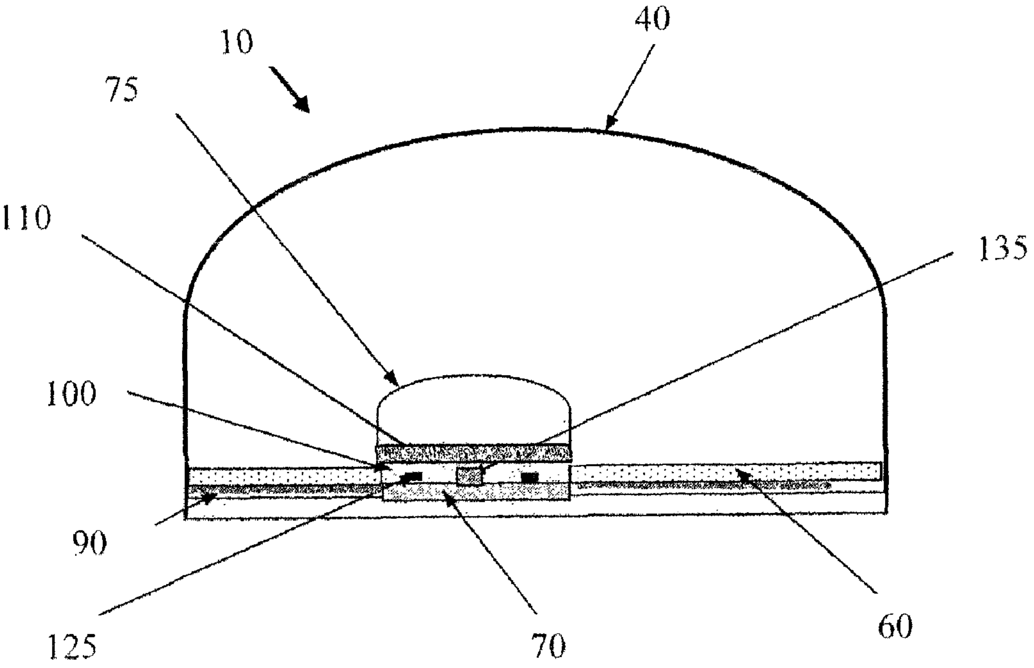
FIG. 4 is a cross sectional view of one embodiment of a solid state lighting device according to the present invention.

According to the third aspect of the present invention as shown in FIG. 4, a solid state lighting device 10 comprising a group of semiconductor light emitting components 20 including a semiconductor light emitter array 80 having more than one emission light spectrum; one single power string line 90; one back-transferred recycling member 60; one diffusive member 40 and a mixing cavity 45 formed inside of the above members.

The semiconductor light emitter array 80 includes a semiconductor blue light emitter and a semiconductor reddish orange light emitter; a first phosphor layer 100 covering all of the semiconductor light array emitters 80 and the space between the semiconductor light array emitters to excite a third spectrum of yellow light; and at least a second phosphor layer 110 on top of the first phosphor layer 100 to excite a fourth spectrum of green light from the leakage blue light.

If a current is supplied to the power string line 90, a combination of a first spectrum of emitted blue light 120, a second spectrum of emitted reddish orange light 130, a third spectrum of excited yellow light 140 from the leakage blue light, and a forth spectrum of excited green light 150 from the leakage blue light produces a mixture of light within ten MacAdam ellipses with at least one point on a blackbody locus, having a correct color temperature in a 2700 K~3500 K range with a color rendering index (CRI) at least 85, as well as a high luminous efficacy at least 90 lm/W.

In some embodiments according to the third aspect of the present invention, the first group of the semiconductor light emitting components 20 includes a dome lens 75 from a high refractive index resin deposited on top of the second phosphor layer 110 to reduce total internal reflection loss.

It is understood that the above description is intended to be illustrative and not restrictive. Although various characteristics and advantages of certain embodiments of the present invention have been highlighted herein, many other embodiments will be apparent to those skilled in the art without deviating from the scope and spirit of the invention disclosed. The scope of the invention should therefore be determined with reference to the claims contained herewith as well as the full scope of equivalents to which said claims are entitled.

Now that the invention has been described,

What is claimed is:

1. A solid state lighting device comprising:

a first group of semiconductor light emitting components emitting a first spectrum of primary light, said first group of semiconductor light emitting components emitting a near-UV primary light having a peak wavelength range from about 380 nm to 420 nm;

a first wavelength down-conversion layer on top of said first group of semiconductor light emitting components exciting a second spectrum of yellow light having a narrow bandwidth, said first wavelength down-conversion layer comprising a mixture of blue quantum dots, and yellow quantum dots, said first wavelength down-conversion layer exciting a blue spectrum of light having a peak wavelength from about 440 nm to 465 nm, and a yellow spectrum of light having a peak wavelength from about 550 nm to 575 nm and a narrow bandwidth with full width at half maximum less than 75 nm;

a second wavelength down-conversion layer on top of said first wavelength down-conversion layer exciting a third spectrum of light having a peak wavelength between said first spectrum of primary light and said second spectrum of yellow light;

a second group of semiconductor light emitting components emitting a fourth spectrum of light having a peak wavelength longer than said first spectrum of primary light and said second spectrum of yellow light;

a color mixing cavity having a diffusive output window mixing said first spectrum of primary light, said second spectrum of yellow light, said third spectrum of light and said fourth spectrum of light;

a light recycling reflector member around an interior wall of said solid state lighting device, said light recycling reflector member surrounding said first group of semiconductor light emitting components and said second group of semiconductor light emitting components; and a power line electrically connected to said first group of semiconductor light emitting components and said second group of semiconductor light emitting components.

2. A solid state lighting device comprising:

a first group of semiconductor light emitting components emitting a first spectrum of primary light;

a first wavelength down-conversion layer on top of said first group of semiconductor light emitting components exciting a second spectrum of yellow light having a narrow bandwidth;

a second group of semiconductor light emitting components, said second group of semiconductor light emitting components comprising a third spectrum of green semiconductor light emitters and a fourth spectrum of reddish orange semiconductor light emitters, said green semiconductor light emitters and said reddish orange semiconductor light emitters being packaged on a single substrate chip;

a color mixing cavity having a diffusive output window mixing said first spectrum of primary light, said second spectrum of yellow light, said third spectrum of light and said fourth spectrum of light;

a light recycling reflector member around an interior wall of said solid state lighting device, said light recycling reflector member surrounding said first group of semiconductor light emitting components and said second group of semiconductor light emitting components; and a power line electrically connected to said first group of semiconductor light emitting components and said second group of semiconductor light emitting components.

* * * * *